(12) United States Patent
Zhou et al.

(10) Patent No.: US 8,795,763 B2
(45) Date of Patent: Aug. 5, 2014

(54) PERPENDICULAR MAGNETIC MEDIUM WITH SHIELDS BETWEEN TRACKS

(75) Inventors: Yuchen Zhou, San Jose, CA (US); Lijie Guan, San Jose, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1984 days.

(21) Appl. No.: 12/005,182

(22) Filed: Dec. 26, 2007

(65) Prior Publication Data

US 2009/0166184 A1   Jul. 2, 2009

(51) Int. Cl.
*G11B 5/74* (2006.01)

(52) U.S. Cl.
CPC ....................... *G11B 5/746* (2013.01)
USPC ........... 427/128; 427/272; 427/282; 427/127; 427/129; 427/130; 427/131; 369/272.1; 428/826

(58) Field of Classification Search
CPC ....................................................... G11B 5/746
See application file for complete search history.

(56) References Cited

U.S. PATENT DOCUMENTS

| | | | |
|---|---|---|---|
| 6,421,195 B1 | 7/2002 | Rubin et al. | |
| 6,717,770 B1 | 4/2004 | Crawford | |
| 7,147,790 B2 | 12/2006 | Wachenschwanz et al. | |
| 8,076,013 B2 * | 12/2011 | Sonobe et al. | 428/827 |
| 2005/0083605 A1 | 4/2005 | Hu et al. | |
| 2006/0028758 A1 | 2/2006 | Sakurai et al. | |
| 2006/0029834 A1 | 2/2006 | Suwa et al. | |
| 2006/0098334 A1 | 5/2006 | Jayasekara et al. | |
| 2007/0001331 A1 | 1/2007 | Kamata et al. | |
| 2007/0023704 A1 | 2/2007 | Nakada et al. | |
| 2007/0072013 A1 | 3/2007 | Haginoya et al. | |
| 2007/0202260 A1 * | 8/2007 | Ito et al. | 427/355 |
| 2010/0021768 A1 * | 1/2010 | Sonobe et al. | 428/829 |

FOREIGN PATENT DOCUMENTS

JP      2001256630      *   9/2001   ............... G11B 5/65

OTHER PUBLICATIONS

"Recording Performance Study of PMR Media with Patterned Tracks," by Xiaodong Che et al., IEEE Trans. on Magnetics, vol. 43, No. 6, Jun. 2007, pp. 2292-2294.

* cited by examiner

*Primary Examiner* — Mandy Louie
(74) *Attorney, Agent, or Firm* — Saile Ackerman LLC; Stephen B. Ackerman

(57) ABSTRACT

A track shield structure is disclosed that enables higher track density to be achieved in a patterned track medium without increasing adjacent track erasure and side reading. This is accomplished by placing a soft magnetic shielding structure in the space that is present between the tracks in the patterned medium. A process for manufacturing the added shielding structure is also described.

12 Claims, 4 Drawing Sheets

PERPENDICULAR MAGNETIC MEDIUM WITH SHIELDS BETWEEN TRACKS

FIELD OF THE INVENTION

The invention relates to the general field of magnetic recording with particular reference to shielding adjacent tracks from one another.

BACKGROUND OF THE INVENTION

Perpendicular recording at high area density requires increases of track density due to the down-track bit length approaching its smallest size achievable by state-of-the-art write head field down-track gradient. This increase of track-density demands a sharper cross-track field gradient of the writer field as well as better stability and less noise of the magnetic data track in the cross-track direction. Prior study [1] suggests that a patterned track medium, where magnetic data tracks are physically separated from each other by a non-magnetic trench or by a spacer, not only reduces reader noise pickup from erasure bands between the tracks, due to the well defined track width, but also increases on-track data stability against leakage field erasure while the writer is writing on adjacent tracks.

Fabrication of the patterned track medium has been based on two main methods [2-5]—substrate patterning and magnetic layer patterning. In the substrate patterning method, the substrate onto which the magnetic films will be deposited is first patterned into physical tracks. For magnetic layer patterning, the etching is performed after deposition of the magnetic layers and usually terminates within the intermediate layer before reaching the soft under layer (SUL). From a magnetic recording point of view, magnetic layer patterning causes less flux leakage from the SUL edges and reduces noise during read-back. However, it is more expensive to use than substrate patterning.

The actual patterning process is usually done by either ion beam or electron beam exposure of photo-resist which, after developing and baking, then serves as the mask during subsequent ion-milling or chemical etching to etch away part of the underlying substrate or magnetic layers. However, all existing methods to produce a patterned magnetic medium result in physically defined magnetic data tracks that are separated from adjacent tracks by air spacing or by spacing filled with non-magnetic materials.

Even for the gained stability and lower noise of the patterned track magnetic medium, with the track pitch going smaller, the writer pole will need to shrink accordingly if it is to avoid erasing adjacent tracks during writing of current track. This smaller size inevitably degrades the down-track gradient of the write head due to the reduced magnetic volume which, in turn, limits the highest down-track bit density achievable. It is foreseeable that the trade-off between down-track data density and cross-track data density will reach a point where further increases in track density will no longer lead to an effective increase of data area density, due to the density loss in the down-track direction.

Thus, additional head and/or media features that can enable further shrinking of track pitch, without sacrificing significant down-track field gradient, are needed. For example, the write head field in the cross-track direction is required to be confined to the limit of the boundaries of the current track. Write field confinement of this type can be achieved by fully shielding [6] or side shielding [7] the magnetic writer, where the shield structure on the sides partially cancels the field in the adjacent tracks and reduces side erasure. However, due to the spacing that already exists between the tracks in a patterned medium, write field shielding can also be implemented by a shielded structure of the kind disclosed by the present invention.

[1] X. Che, et al, "Recording Performance Study of PMR Media With Patterned Tracks," IEEE *Trans. Magn.*, vol. 43, pp. 2292, 2007

[2] D. E. Wachenschwanz, et al, "Perpendicular magnetic discrete track recording disk," U.S. Pat. No. 7,147,790 B2 (2006)

[3] Y. Kamata, et al, "Method for manufacturing substrate for discrete track recording media and method for manufacturing discrete track recording media," US Patent Pub. #: US 2007/0001331 A1 (2007)

[4] K. Nakada, K. Hattori, and S. Okawa, "Pattern drawing method, stamper manufactureing method, and pattern drawing apparatus," US Patent Pub. #: US 2007/0023704 A1 (2007)

[5] C. Haginoya, T. Ando, and M. Ogino, "Magnetic recording medium and method for production thereof," US Patent Pub. #: US 2007/0072013 A1 (2007)

[6] H. L. Hu, Y. S. Tang, L. Guan and K. Ju, "Fully shielded perpendicular recording writer," US Patent Pub. #: US 2005/0083605 A1 (2005).

[7] W. P. Jayasekara, and H. S. Gill, "Laminated side shield for perpendicular write head for improved performance," US Patent Pub. #: US 2006/0098334 A1 (2006).

A routine search of the prior art was performed with the following additional references of interest being found:

U.S. Pat. No. 6,421,195 (Rubin et al) shows channels, running along radii in a direction normal to the tracks' path, separated by channel boundaries that may be magnetic and have substantially different magnetic properties than those of the channels. In U.S. Pat. No. 6,717,770, Crawford discloses tracks separated by guard bands, while U.S. Patent Application 2006/0028758 (Sakurai et al) shows tracks separated by guard bands which are a groove or non-magnetic material and in U.S. Patent Application 2006/0029834, Suwa et al. show a non-magnetic filler layer between tracks.

SUMMARY OF THE INVENTION

It has been an object of at least one embodiment of the present invention to increase track density on a magnetic recording disc.

Another object of at least one embodiment of the present invention has been that said increase in track density be achieved without affecting the adjacent track erasure field or increasing the level of read-back noise.

Still another object of at least one embodiment of the present invention has been that said increase in track density not interfere with the operation of the servo bits.

A further object of at least one embodiment of the present invention has been to provide a process for the manufacture of a magnetic recording disc that satisfies the objects recited above.

These objects have been achieved by placing a soft magnetic shielding structure in the space that is present between the tracks in the patterned medium. This magnetic shielding structure is magnetically isolated from the patterned data tracks. The advantages of using the shield structure within the trench between two adjacent patterned tracks are twofold:

First, during writing the shield absorbs leakage flux from the write head and channels the side flux directly to the soft underlayer to help reduce erasure of adjacent tracks. Such shielding mechanism helps confine the write field to the current track.

Secondly, during data read-back, with the read head free layer being much closer to the current track (10~20 nm), most of the magnetic flux emitted from the on-track data bits are concentrated by the reader free layer. The shield structure mainly experiences the medium field from adjacent tracks and attracts magnetic flux of adjacent tracks from affecting the reader signal. Thus, it may also act as shielding against side reading during read-back.

DESCRIPTION OF THE PREFERRED EMBODIMENTS

Figure 1:
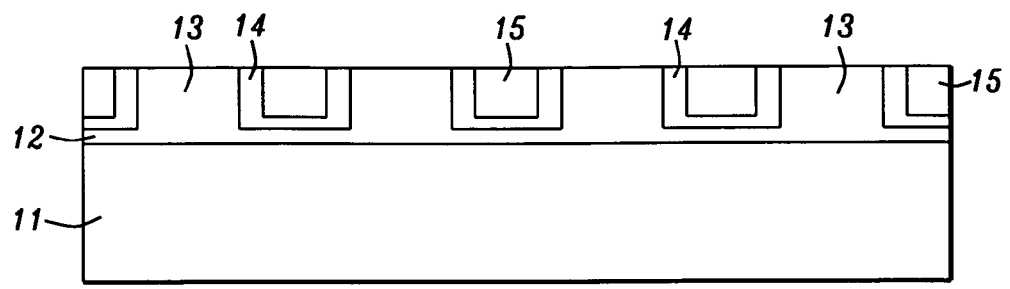
FIG. 1 illustrates the major features of the invention.

FIG. 1 is an illustrative overview of the invention. Shown there is an example of a between-track soft magnetic shielding wall in a patterned track magnetic medium. After patterning of the magnetic recording layers into isolated data tracks 13, non-magnetic spacer layer 14 is deposited into the trenches that separate the adjacent data tracks. Afterwards, soft magnetic material is deposited into the trenches as well over 14 thereby fully filling the trench area. This soft magnetic line that is conformal with the patterned track runs between adjacent tracks and acts as magnetic flux shielding wall 15 within the patterned medium.

Underlayer 11 serves as the substrate on which the thin film layers of the medium are to be deposited. Etched layer 12 is where etching to form the patterned track was terminated. Patterned layer 13 is the layer that is being patterned into physical tracks. Underlayer 11 supports the non-magnetic layer 12 while layer 13 includes all the magnetic and non-magnetic layers that form the working medium, for example the soft underlayer (SUL), the inter layers and the recording layer. In this structure (i.e. the invention), the physical tracks are completely magnetically isolated from each other.

Underlayer 11 can also include the substrate as well as the entire SUL, with 12 being the non-magnetic inter layers and 13 being the magnetic recording layer. In this example the physical tracks are magnetically isolated at only the recording layer level and share a continuous SUL. In both cases, non-magnetic layer 14 has been deposited inside the space between adjacent tracks and forms a coating on the edges of the patterned tracks. Afterwards, a soft magnetic layer 15 will be deposited on top of 14 and magnetically isolated from the patterned track 13 to form the between-track shielding structure.

Since the shielding wall 15, between the tracks, is continuous in the down-track direction, it has a down-track shape anisotropy that can help retain the magnetization of the shield along the down-track direction under low field conditions so that it will not produce significant noise during reader read-back. However, since it is soft material, during writing (when the head field being much stronger) the shield can be magnetized by the head field, thereby attracting most of the write head side flux and helping to reduce the effective field in the adjacent track during writing.

Figure 2:
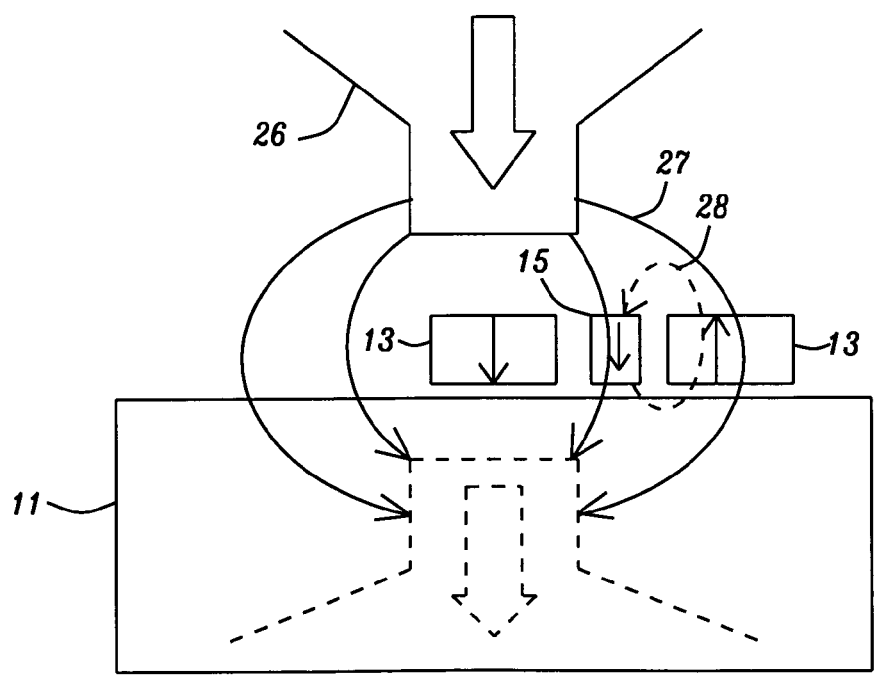
FIG. 2 is a schematic illustration of how the shielding wall acts against erasure of an adjacent track.

FIG. 2. is a schematic illustration of how the shielding wall acts against erasure of the adjacent track. The shielding wall will be magnetized in the same direction as the track that the write head writes on. It will generate a magnetic field in the adjacent track that partially cancels the fringing write field, thereby helping to reduce erasure in the adjacent track.

Figure 3:
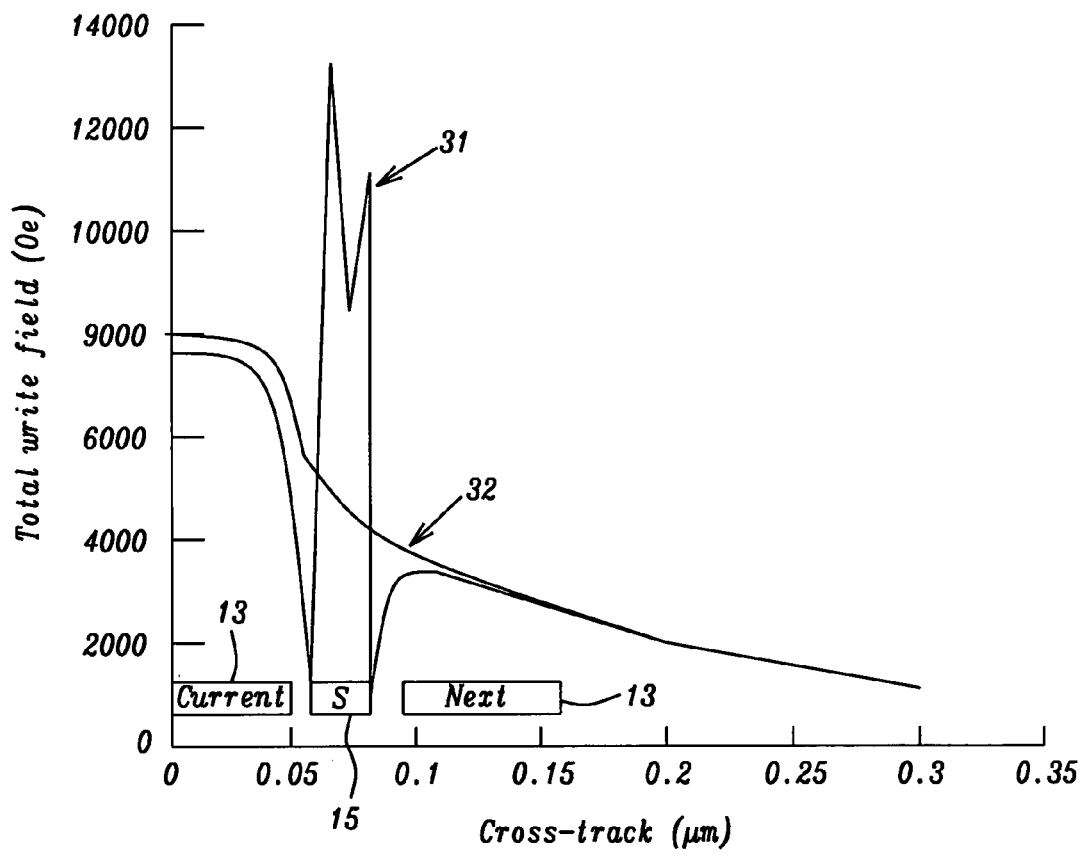
FIG. 3 is a simulated plot of the total magnetic write field in the cross track direction at the surface, with and without the shielding wall.

FIG. 3 shows a simulated plot of the total magnetic write field along the cross track direction at the medium surface with and without the shielding wall between the patterned data tracks (curves 31 and 32 respectively). The simulated track-pitch is 140 nm with the shielding walls in the trench between the tracks having a 20 nm thickness and a 20 nm width (cross-track). It shows that the presence of the shielding wall reduces the highest erasure field in the adjacent track from 4 kOe to 3 kOe, a reduction of about 25%. The side writing flux diversion concentration effect is also manifested by the high field directly above the shielding wall. With further optimization of the shielding wall magnetic moment and the aspect ratio, the shielding effect can be even further enhanced.

Figure 4A:
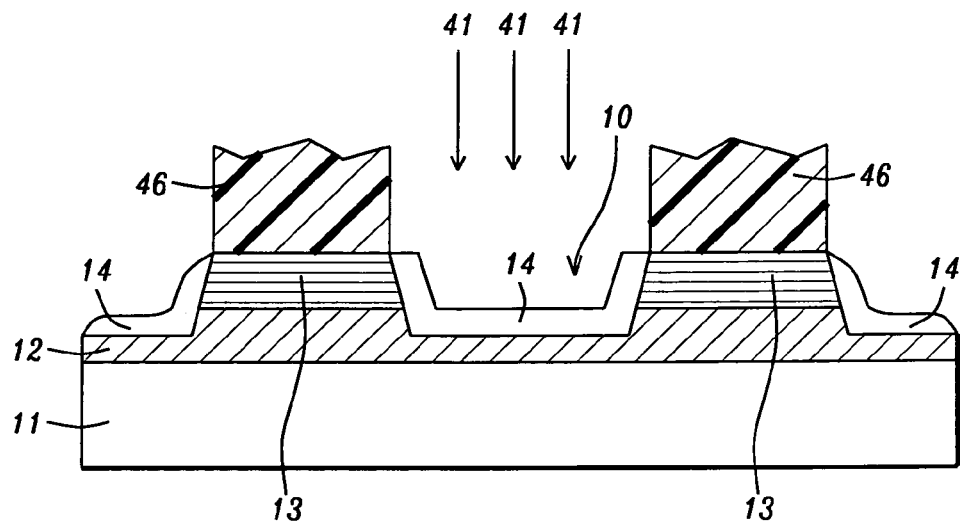
FIGS. 4A-C illustrate the principal steps in the process of the invention.
Figure 4B:
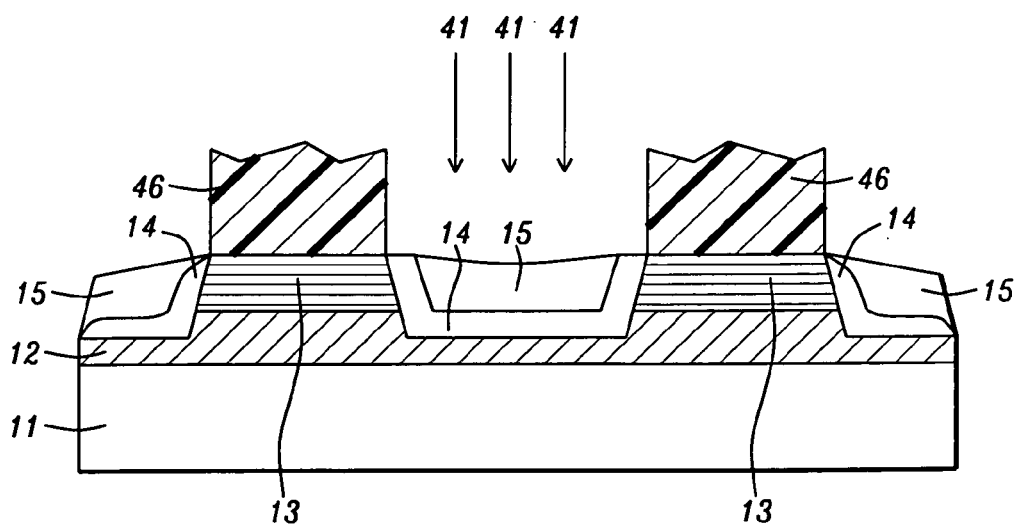
Figure 4C:
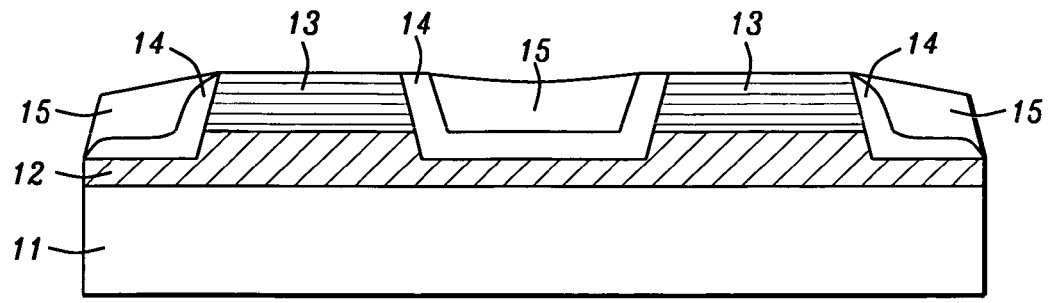

In FIGS. 4A to 4C we illustrate the process used to deposit the soft magnetic shielding wall in the trenches between the patterned tracks. It is to be understood that this process is presented primarily for illustrative purposes and that other processes could, in principle, be utilized to achieve the same result.

High angle (i.e. near perpendicular) deposition 41 is used to form magnetic-isolation layer 14 in the trench, including on the sidewalls of patterned track 13. As mentioned previously with respect to FIG. 3, cross-track width of isolation layer 14 may be 20 nm. In another embodiment, the cross-track width of the isolation layer may be from 10 to 50 nm which also represents the distance of the trench 10 from its closest data track. Following deposition of isolation layer 14, soft magnetic shield layer 15 is similarly deposited on isolation layer, and into the trench where it forms the needed shielding wall between patterned tracks 13.

Possible deposition methods include (but are not limited to) IBD (ion beam deposition) having a tilt angle less than 30 degrees. IBD deposition can also be almost perpendicular and, can be used with a shaper to improve edge-to-center uniformity. Another possible method is PCM (point cusp magnetron deposition) which is a type of PVD (physical vapor deposition). With suitable bias, the isolation layer and the soft magnetic materials can be deposited as conformal coatings to obtain a controlled coverage ratio when using PCM.

The isolation material that makes up layer 14 can be (but is not limited to) Ru or $Al_2O_3$, where Ru-ALD (atomic layer deposition) or ALCVD (Atomic layer chemical vapor deposition) may also be used to deposit a conformal film for the isolation layer. To facilitate removal of photoresist layer 46 (in FIGS. 4a and 4b) at the conclusion of photolithography, a lift-off mask may be used. Alternatively, for very small dimensions CMP (chemical mechanical polishing) can be used to remove the photoresist once it has served its purpose.

Soft magnetic shielding wall 15 can be a one or more layers of a soft magnetic material such as Ni, Fe, B, Co, Cr, Nb, or Zr (either pure or nitrogen doped). Alternatively, it could be a multilayer structure made by alternating soft magnetic and non-magnetic layers. The soft layers would be as just described while the non-magnetic layers would be one or more elements such as Al, Cr, Ta, Ti, Hf, Zr, or Ru, or their oxides.

Figure 5A:
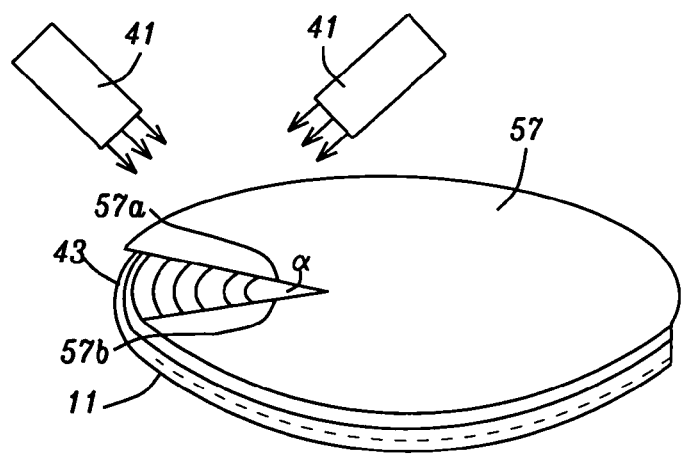
FIG. 5A shows how improved thickness uniformity of the deposited shielding layer can be achieved.

Deposition of isolation layer 14 and soft magnetic layer 15 can be performed over the entire disk surface simultaneously but better uniformity can be achieved by using a rotary deposition scheme of the type illustrated in FIG. 5A. Shown there is a scheme wherein a stencil (for example, metal shaper 57) covers the entire disk except for a small sector-shaped area, also referred to as a missing sector, that is the region between edges 57e1, 57e2. According to one embodiment, the angle α subtended by the missing sector is from 5 to 30 degrees. In another embodiment, the angle α subtended by the missing sector ranges from 1 to 90 degrees. This stencil is held in place by a metal frame so that only a small fraction of the disk is exposed to the deposition beam at any given time. During deposition, the disk is rotated below the mask thereby achieving uniform deposition around the circumference.

Figure 5B:
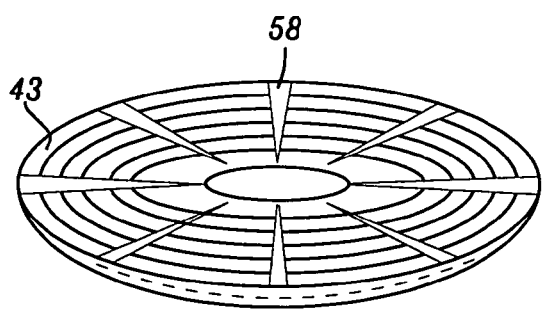
FIG. 5B shows how the servo bits can be left unchanged at the termination of the process of the invention.

As documented in the prior art, servo bits are customarily patterned into the medium at the time of track patterning. However, implementation of the present invention, as described thus far, will allow soft shielding material to be deposited between the patterned servo bits as well as the data tracks, thereby causing significant noise during read back. To avoid this problem, we use additional protection mask 58, shown in FIG. 5B, which comprises a set of sectors that correspond to those sectors on the disk in which the servo bits will be located. This protection mask, which can be supported at its edges by a metal frame (not shown), can be attached to the disk (and then suitably aligned relative thereto) so that it rotates together with the disc during deposition, thereby keeping the servo sections of each sector free of shield material. A more expensive way to achieve the same result would be to use a contact mask which is selectively removed following shield deposition.

ADVANTAGES OF THE INVENTION

The advantages of using a shield layer located in trenches between adjacent patterned tracks are twofold. First, during writing, the shield absorbs leakage flux from the write head to help reduce erasure of the adjacent tracks. Such shielding helps to limit the write field to its current track. Secondly, during data read-back, with the read head free layer being much closer to the current track (10~20 nm), most of the magnetic flux emitted from the on-track data bits is concentrated by the reader's free layer. The shield structure mainly experiences the medium fields of adjacent tracks thereby keeping the magnetic flux of adjacent tracks from affecting the reader signal. Thus, it is expected to also act as shielding against side reading during read-back.

Thus, the invention enables a higher track density to be achieved while maintaining the same erasure field and read-back noise specifications.

What is claimed is
1. A process for forming magnetic data tracks on a recording disc, comprising:
depositing an underlayer of magnetically soft material on said disc;
depositing a first non-magnetic layer, having a surface, on said underlayer;
depositing a layer of magnetic recording material on said non-magnetic layer;
by using a mask, patterning said magnetic recording layer into at least two concentric data tracks whereby there are ring shaped trenches having floors and sidewalls, on each side of said data tracks each such trench extending downwards a distance below said first non-magnetic layer surface;
while leaving said mask in place, depositing a conformal coating of a second non-magnetic material in said trench, including on said floor and sidewalls;
then depositing a conformal layer of magnetic shielding material on said conformal second layer of non-magnetic material to a sufficient thickness to just fill the trenches; and
then removing said mask, whereby each of said data tracks has a shielding track on both sides thereof.

2. The process recited in claim 1 further comprising:
providing a rigid masking disc that fully overlies, does not touch, and is concentric with, said recording disc;
said masking disc being continuous except for a missing sector that subtends an angle;
supporting said masking disc on a frame that is free of any contact with said recording disc; and
rotating said recording disc relative to said masking disc during deposition of said magnetic shielding layer, thereby improving thickness uniformity of said magnetic shielding layer on said recording disc.

3. The process recited in claim 2 wherein the angle subtended by said missing sector ranges from 5 to 30 degrees.

4. The process recited in claim 2 wherein the angle subtended by said missing sector ranges from 1 to 90 degrees.

5. The process recited in claim 1 further comprising:
providing a protection mask that is a set of sectors concentrically attached to said recording disc and that lies directly above all physically patterned servo bits on said recording disc, whereby, during deposition of said layer of magnetic shielding material, no spaces between adjacent servo bits become filled with magnetic shielding material.

6. The process recited in claim 1 wherein the step of removing the mask is accomplished by using liftoff technology or by using chemical mechanical polishing.

7. The process recited in claim 1 wherein the steps of depositing a conformal coating of non-magnetic material and depositing a conformal layer of magnetic shielding material are accomplished by using one or more IBD (ion beam deposition) sources, having a tilt angle less than 30 degrees or by using PCM (point-cusp magnetron) sputter deposition, including substrate bias to obtain a controlled coverage ratio.

8. The process recited in claim 3 wherein said magnetic shielding layer is one or more magnetic layers selected from the group consisting of Ni, Fe, B, Co, Cr, Nb, Zr, and N.

9. The process recited in claim 8 further comprising inserting one or more non-magnetic layers of elements chosen from among the group consisting of Al, Cr, Ta, Ti, Hf, Zr, Ru, and their oxides between said one or more magnetic layers of said magnetic shielding layer wherein a multilayer shielding structure is formed by alternating the one or more magnetic layers and the one or more non-magnetic layers.

10. The process recited in claim 1 wherein said non-magnetic material is selected from the group consisting of Al, Cr, Ta, Ti, Hf, Zr, Ru, and their respective oxides.

11. The process recited in claim 1 wherein said trench is located a distance of half a track pitch from adjacent data tracks.

12. The process recited in claim 1 wherein said trench is located a distance in the range of from 10 to 50 nanometers from its closest data track.

* * * * *